(12) United States Patent
Manninen

(10) Patent No.: US 7,340,955 B2
(45) Date of Patent: Mar. 11, 2008

(54) CAPACITIVE ACCELERATION SENSOR ARRANGEMENT

(75) Inventor: Hannu Manninen, Espoo (FI)

(73) Assignee: VTI Technologies Oy, Vantaa (FI)

(*) Notice: Subject to any disclaimer, the term of this patent is extended or adjusted under 35 U.S.C. 154(b) by 146 days.

(21) Appl. No.: 10/873,614

(22) Filed: Jun. 23, 2004

(65) Prior Publication Data

US 2006/0162454 A1 Jul. 27, 2006

(30) Foreign Application Priority Data

Jun. 25, 2003 (FI) .................................. 20030946

(51) Int. Cl.
*G01P 15/125* (2006.01)
(52) U.S. Cl. .................................. 73/514.32; 324/661
(58) Field of Classification Search ............. 73/514.32; 324/661, 662
See application file for complete search history.

(56) References Cited

U.S. PATENT DOCUMENTS

| | | | | |
|---|---|---|---|---|
| 4,499,877 A | * | 2/1985 | Iwata ..................... | 123/406.37 |
| 4,860,232 A | * | 8/1989 | Lee et al. .................... | 702/104 |
| 5,977,803 A | * | 11/1999 | Tsugai .......................... | 327/94 |
| 6,188,340 B1 | * | 2/2001 | Matsumoto et al. ........ | 341/110 |
| 6,901,801 B2 | * | 6/2005 | Campbell et al. ......... | 73/514.32 |
| 2003/0005391 A1 | * | 1/2003 | Matsumoto et al. ........... | 716/1 |
| 2005/0022598 A1 | * | 2/2005 | Campbell et al. ......... | 73/514.32 |

FOREIGN PATENT DOCUMENTS

JP 63-212768 9/1988
JP 1-115718 5/1989

OTHER PUBLICATIONS

Kraft M. et al. "Closed Loop Micromachined Inertial Sensors with Higher Order ΣΔ-Modulators"; Nanotech 2001; 4 pages.
Kung, J.T. et al; "Digital *Cancellation of Noise and Offset for Capacitive Sensors*", IEEE Transactions on Instrumentation and Measurement, IEEE Inc., vol. 42, No. 5, XP000404057, Oct. 1, 1993, pp. 939-942.

* cited by examiner

*Primary Examiner*—Hezron Williams
*Assistant Examiner*—Samir M. Shah
(74) *Attorney, Agent, or Firm*—Squire, Sanders & Dempsey LLP

(57) ABSTRACT

The present invention relates to measuring devices used in measuring acceleration, and, more specifically, to capacitive acceleration sensors. The improved sensor arrangement of the invention enables reliable and effective measuring of acceleration, in small capacitive acceleration sensor designs, in particular. The acceleration sensor arrangement measuring circuitry of the present invention can also be applied for multi-terminal sensors, such as, for example, acceleration sensors with three axes, by using time division signal multiplexing.

25 Claims, 5 Drawing Sheets

CAPACITIVE ACCELERATION SENSOR ARRANGEMENT

FIELD OF THE INVENTION

The present invention relates to metering devices used in the measuring of acceleration and, more specifically, to capacitive acceleration sensors. The object of the invention is to provide an improved sensor arrangement, which enables reliable and effective measuring of acceleration, in particular in small capacitive acceleration sensor designs.

BACKGROUND OF THE INVENTION

Measuring based on a capacitive acceleration sensor has proved to have a simple principle and to provide a reliable method in the measuring of acceleration. The capacitive measuring is based on a change in the gap between two surfaces of a pair of electrodes of the sensor. The capacitance between the surfaces, i.e. the capacity for storing electric charge, depends on the area of the surfaces and on the distance between the surfaces. Capacitive measuring can be used already at rather low measuring ranges of acceleration.

The measuring principle of the capacitive sensor essentially affects the precision of measurement of the sensor. One optimal method of measuring for a capacitive acceleration sensor is, in fact, to measure the sensor such, that the charge across the electrodes to be measured remains equal, whereby the electrostatic forces caused by the charge compensate each other and the error of measurement caused by them will be minimized.

Prior art will be described below with exemplifying reference to the appended drawing, in which:

FIG. 1 shows a measuring circuitry of an acceleration sensor arrangement according to prior art.

FIG. 1 shows a measuring circuitry of an acceleration sensor arrangement according to prior art. The measuring circuitry of the acceleration sensor arrangement according to prior art comprises a measured sensor 1, i.e. pairs of electrodes, a charge amplifier 2, an analog integrator 3 and a feedback connection 4.

In the measuring circuitry of an acceleration sensor arrangement according to prior art, the charge amplifier 2 detects the potential difference, which exists between the output signal Vm from the analog integrator 3 and the central electrode of the sensor 1, and transforms the charge, which, due to the potential difference, flows to the amplifier 2 into a voltage. The received voltage is integrated by the analog integrator 3, until a state is reached, where the output signal Vm represents an ideal voltage distribution. Thus, the circuit is in state, where there is a balance of charge ($Q_{C1}=Q_{C2}$) between the terminals of the capacitors C1 and C2 of the measured sensor 1.

The measuring circuitry of an acceleration sensor, according to prior art, transforms, out of the value of the capacitances C1 and C2 of the sensor, an analog voltage $Vm=Vr*(C1-C2)/(C1+C2)$, which is proportional to the reference voltage Vr in use, and which has a very linear response in the utilized acceleration sensors.

The problems in the acceleration sensor measuring circuitry according to prior art are the offset errors in the analog integrator, which always, however, affect the functioning of the circuit. In addition, the analog integrator is sensitive to interference, in a multiplexed application, in particular.

There is also a problem in the acceleration sensor measuring circuitry according to prior art concerning the charge amplifier in a need for a large uniform range of operation because of the variation in sensor capacitances, and also, in the multiplexed case, a need for a large bandwidth, which presents a challenge for the design of the charge amplifiers and tends to increase the power consumption in the prestage.

SUMMARY OF THE INVENTION

The object of the present invention is to provide an improved sensor arrangement, such that advantages of symmetry are achieved, and which arrangement enables reliable and effective measuring of acceleration, in particular in small capacitive acceleration sensor designs.

According to a first feature of the present invention there is provided a capacitive acceleration sensor arrangement, the arrangement comprising at least one measured pair of electrodes for the capacitive measuring of acceleration, such that the arrangement further comprises a digital comparator,
a digital integrator,
a D/A converter positioned in a feedback branch connection between the output from the digital integrator and the digital comparator, and
a clock signal generator, such, that the digital comparator detects the voltage difference between the output signal from the digital integrator, which signal has been converted into analog form in the D/A converter, and the central electrode of the measured pair of electrodes, and converts the difference in potential into a corresponding digital signal, and that the digital signal representing the difference in potential received from the digital comparator is added in the digital integrator, from which digital integrator a digital output signal is obtained as an output.

Preferably, the digital output signal output from the digital integrator is directed towards a state, where a balance of charge exists between the terminals of the capacitors of the measured pair of electrodes. Preferably, the digital integrator is implemented by means of an up-down counter. Alternatively, the digital integrator is implemented by means of digital counter logic. Further, preferably, the digital counter logic, in addition to controlling the digital integrator, also controls the D/A converter.

Preferably, the clocking from the clock signal generator is adapted to provide a suitable measuring function. Preferably, at the input, instead of the digital comparator, a combination of a charge amplifier and a comparator is being used. Preferably, there is an A/D conversion combined with the analog measuring function of the pair of electrodes to be measured. Preferably, further calibration of the pair of electrodes to be measured is performed digitally.

According to a second feature of the present invention there is provided a capacitive acceleration sensor arrangement, said arrangement comprising a set of pairs of electrodes to be measured for capacitive measuring of acceleration, such, that the arrangement further comprises a digital comparator,
a set of digital integrators,
a set of time division multiplexors,
control logic for the multiplexors,
a D/A converter positioned in a feedback branch connection between the output from the digital integrators via the multiplexor and the digital comparator, and
a clock signal generator, such, that the digital comparator detects the voltage difference between the output signal from the digital integrators via the multiplexor, which signal has been converted into analog form in the D/A converter, and the central electrode of the measured pairs of electrodes, and converts the differences in potential into corresponding digital signals, and that the voltage representing each sensor, converted by the digital comparator, is added in the digital integrator, from which digital integrator a digital output signal is obtained as an output.

Preferably, time division multiplexing is used in the measuring, such that, using time division by means of the multiplexor, during one time slot the measuring of one sensor is performed and, correspondingly, the measuring of each consecutive sensor is performed during each subsequent time slot. Preferably, the digital output signal output from the digital integrator is directed towards a state, where a balance of charge exists between the terminals of the capacitors of the measured pair of electrodes for each sensor.

Preferably, the digital integrator is implemented by means of an up-down counter. Alternatively, the digital integrator is implemented by means of digital counter logic. Further, preferably, the digital counter logic, in addition to controlling the digital integrator, also controls the D/A converter.

Preferably, the clocking from the clock signal generator is adapted to provide a suitable measuring function. Preferably, at the input, instead of the digital comparator, a combination of a charge amplifier and a comparator is being used. Preferably, an A/D conversion is combined with the analog measuring functions of the pairs of electrodes to be measured. Preferably, further calibration of the pairs of electrodes to be measured is performed digitally.

The digital integrators are, preferably, implemented by means of sub-micron CMOS technology. Preferably, the circuitry is adapted to function at very low voltages, below 2.0 volts. Preferably, the sensitivity variations in connection with the processing of the pairs of electrodes to be measured are calibrated by adjusting the transfer function of the D/A converter.

Preferably, the digital output signal directly consists of the outputs of the digital integrators, which outputs are transferred to further processing as a signal in parallel form. Alternatively, the digital output signal directly consists of the outputs of the digital integrators, which outputs are transferred to further processing as a signal in serial form.

Preferably, the power consumption of the D/A converter is adapted to a low level by means of CMOS technology and SC circuit technique. Preferably, the arrangement is adapted for sensors with multiple terminals. Alternatively, the arrangement is adapted for an acceleration sensor with three axes.

Preferably, the arrangement further comprises circuit elements, by means of which parasitic capacitances are eliminated. Alternatively, the arrangement further comprises circuit elements, by means of which non-idealities are eliminated.

BRIEF DESCRIPTION OF THE DRAWINGS

The present invention and its preferable embodiments will be described in detail below, with exemplifying reference to the accompanying drawings, of which:

FIG. 1 has been described above. Below, the present invention and preferable embodiments thereof will be described with reference to FIGS. 2-3.

DETAILED DESCRIPTION OF THE INVENTION

Figure 1:
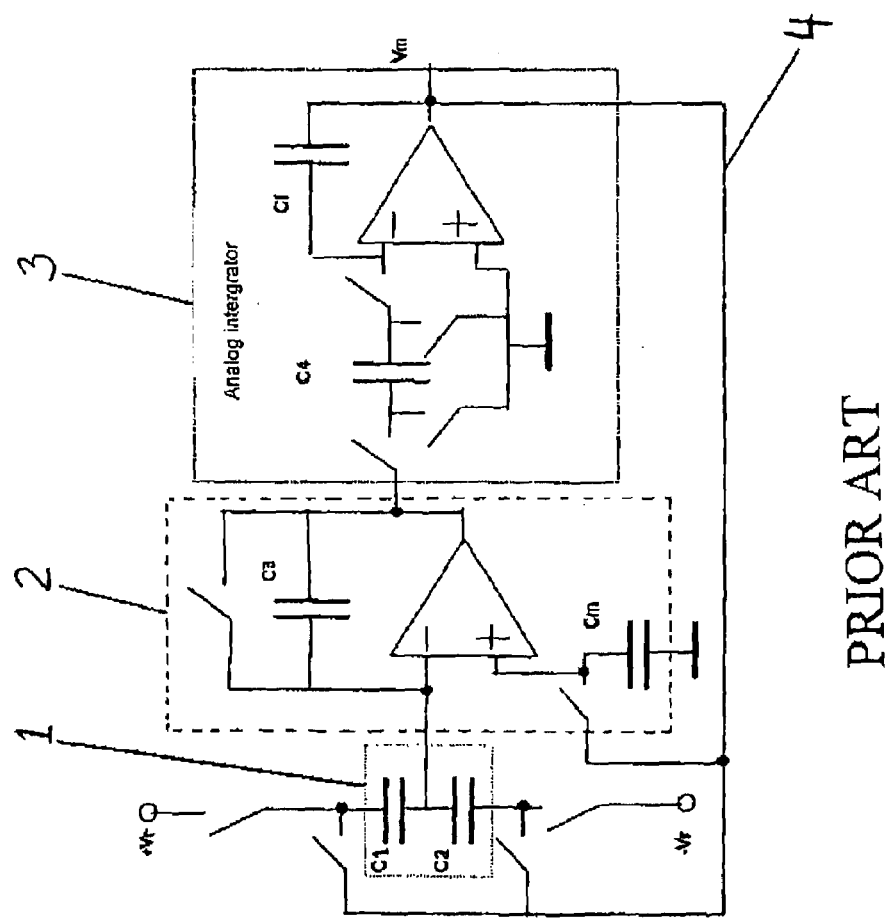
FIG. 1 shows a measuring circuitry of an acceleration sensor arrangement according to prior art.
Figure 2:
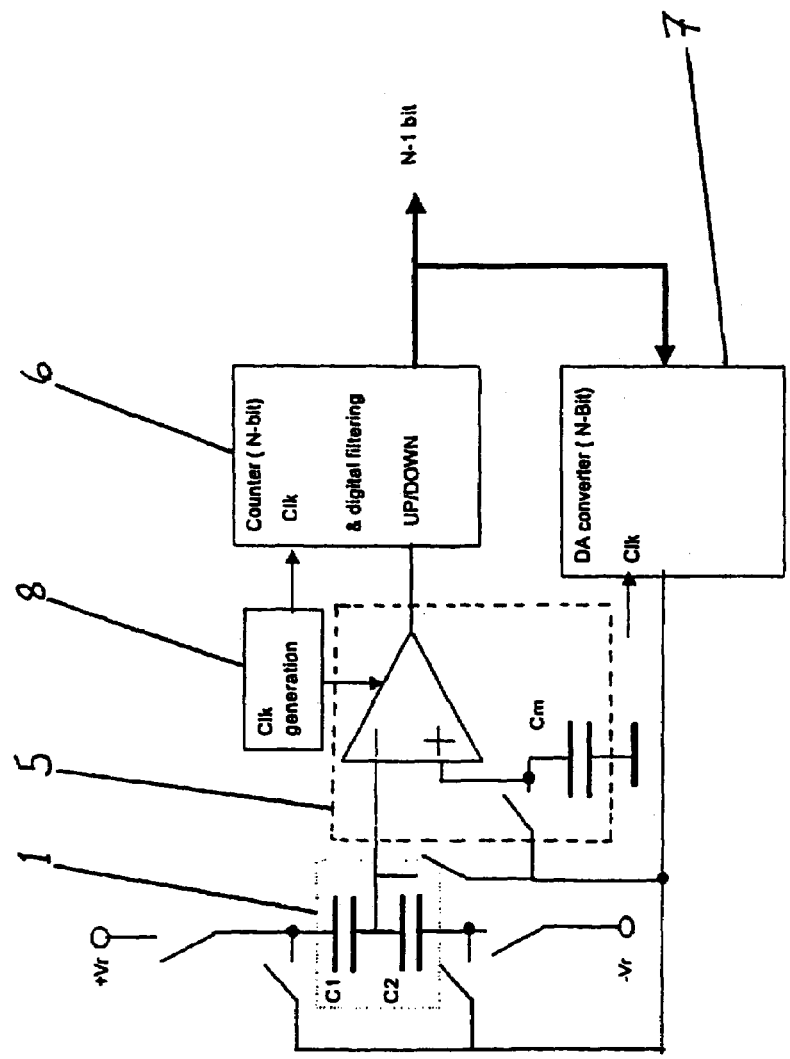
FIG. 2 shows a measuring circuitry of an acceleration sensor arrangement according to the present invention.

FIG. 2 shows a measuring circuitry of an acceleration sensor arrangement according to the present invention. The acceleration sensor arrangement measuring circuitry according to the present invention comprises a sensor 1 to be measured, i.e. pairs of electrodes, a digital comparator 5, a digital integrator 6, a clock signal generator 8 and a D/A converter 7 positioned in a feedback branch connection.

The digital comparator 5 in the acceleration sensor arrangement measuring circuitry according to the present invention detects the voltage difference existing between the output signal from the digital integrator 6 converted into analog form in the D/A converter 7 and the central electrode of the sensor 1, and converts the difference in potential into a corresponding digital signal.

The digital signal corresponding to the difference in potential obtained from the digital comparator 5 is added in the digital integrator 6, from which a digital output signal is received as output. The digital output signal from the digital integrator 6 is directed towards a state, where there is a balance of charge ($Q_{C1}=Q_{C2}$) between the terminals of the capacitors C1 and C2 of the measured sensor 1.

The digital integrator 6 can be implemented by, for instance, an up-down counter or by digital counter logic. In addition to the digital integrator 6, also the D/A converter 7 can be controlled by means of the digital counter logic.

Figure 4:
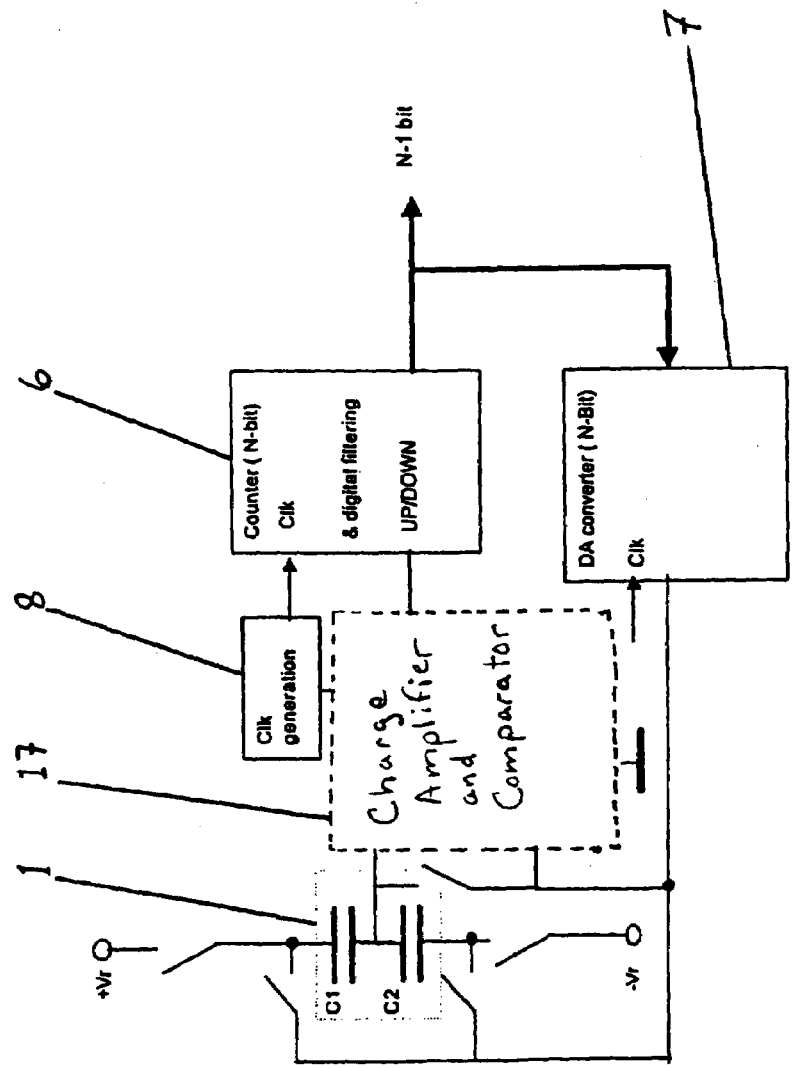
FIG. 4 shows a measuring circuitry of an acceleration sensor arrangement according to the present invention, in which a combination of a charge amplifier and a comparator replace the digital comparator.

The D/A converter 7 is positioned in a feedback branch connection has been added to the acceleration sensor measuring circuitry according to the present invention, which converter manages the necessary feedback to the comparator circuit 5. By the use of suitable clocking by means of the clock signal generator 8, a circuitry implementing a suitable measuring function is achieved. Alternatively, at the input, instead of the digital comparator 5, a combination of a charge amplifier and a comparator 17 may be used, as shown in FIG. 4.

By means of the solution according to the present invention, the signal will be converted into digital form. In the solution, the digital conversion is combined with the analog sensor measuring function, whereby a digital signal is provided as the output signal of the sensor. In the solution according to the present invention, further calibration of the sensor may thus be performed digitally immediately, and no separate A/D converter is required.

Figure 3:
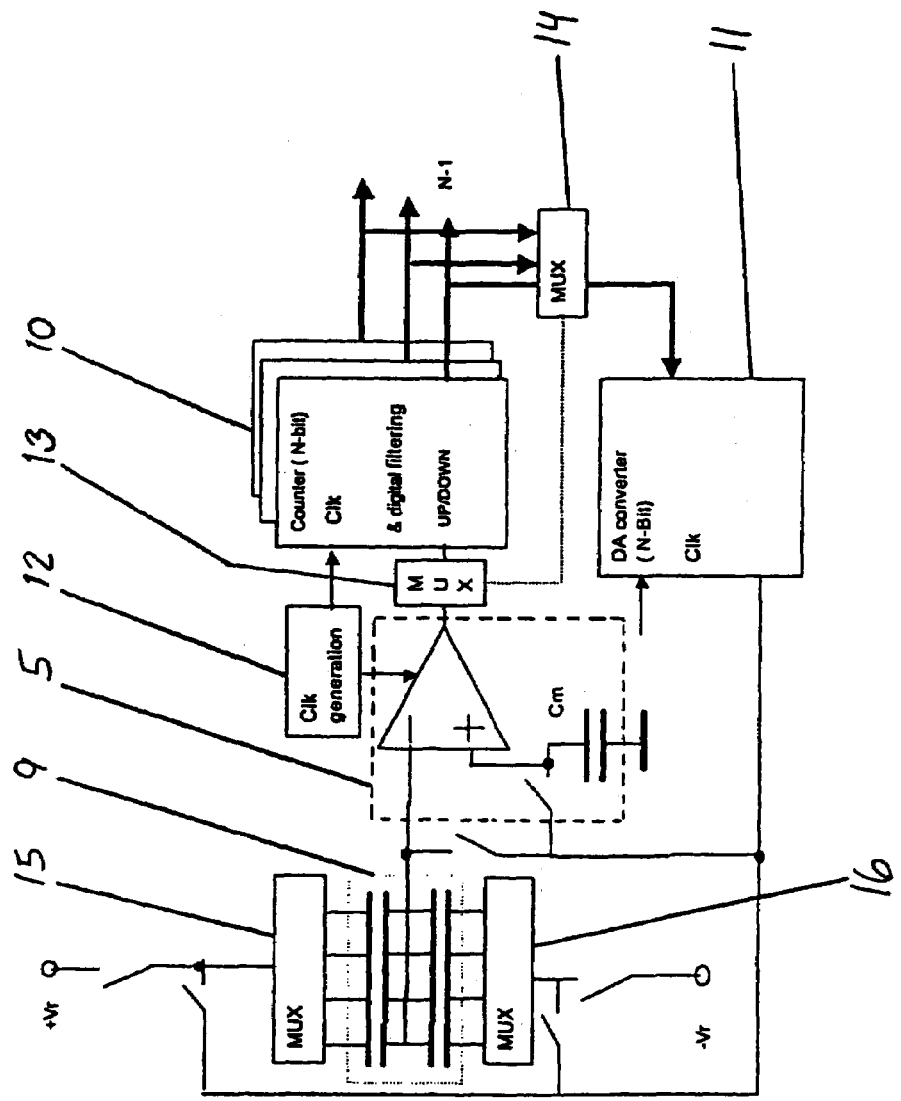
FIG. 3 shows a measuring circuitry of an alternative acceleration sensor arrangement according to the present invention.
Figure 5:
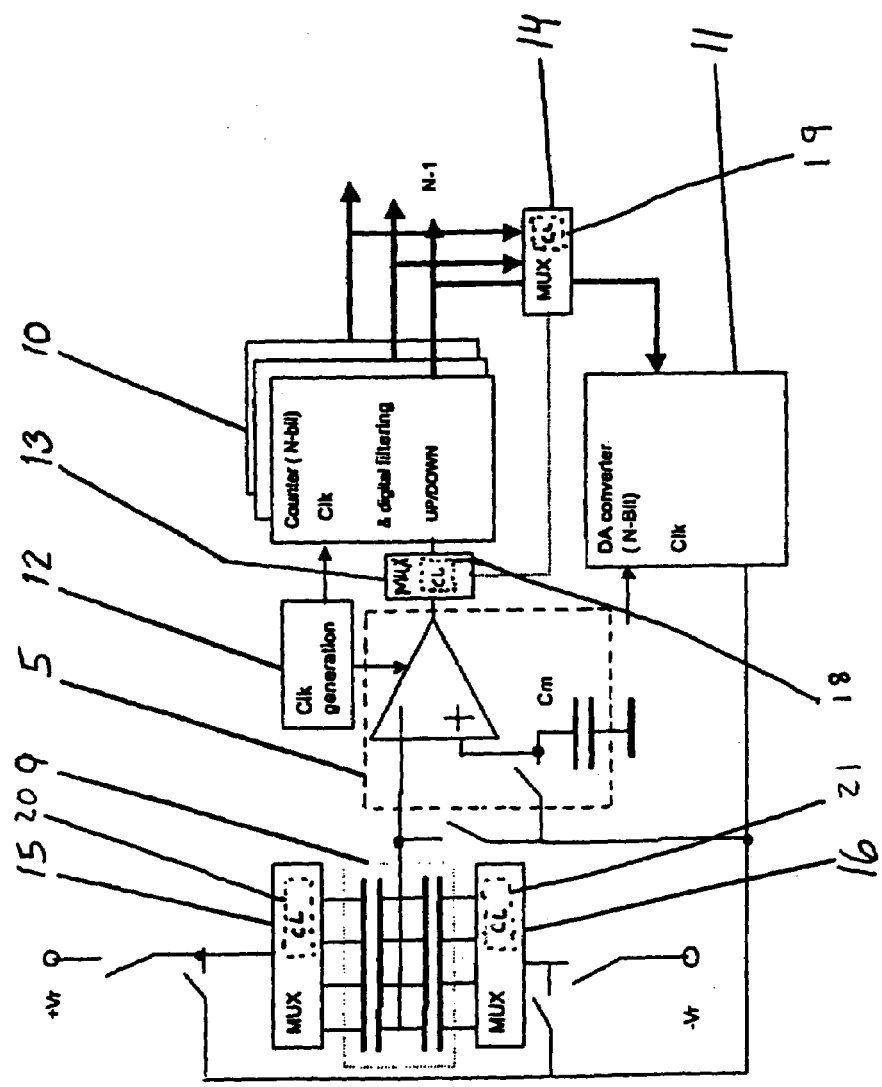
FIG. 5 shows a measuring circuitry of an alternative acceleration sensor arrangement according to the present invention, in which control logic for the multiplexers is illustrated.

FIGS. 3 and 5 shows alternative measuring circuitry of an acceleration sensor arrangement according to the present invention. The alternative acceleration sensor arrangement measuring circuitry according to the present invention comprises a set of sensors 9 to be measured, i.e. multiple pairs of electrodes, a digital comparator 5, a set of digital integrators 10, a clock signal generator 12, a D/A converter 11 positioned in a feedback branch connection, and time division multiplexers 13-16 and control logic 18-21 for the mulitplexers 13-16.

The measuring by the alternative measuring circuitry of an acceleration sensor according to the present solution is adapted for multi-terminal sensors using time division signal multiplexing. The measuring circuitry comprises the multiplexors 13-16, by means of which, taking turns, the measuring of one sensor at a time is performed in one time slot, and the measuring of the next sensor, correspondingly, is performed during the following time slot, etc.

In the alternative acceleration sensor measuring circuitry according to the present solution, the digital comparator 5 detects the voltage differences, received from the sensors 9 to be measured, between the output signal from the digital integrators 10 via the multiplexor, converted into analog form in the D/A converter 11, and the central electrodes of the sensors 9, and converts the differences in potential into corresponding digital signals.

The voltage representing each sensor, converted by the digital comparator 5, is added in the digital integrator 10, from which a digital output signal is obtained as an output. The digital output signal output from the digital integrator 10 is directed towards a state, where a balance of charge ($Q_{C1}=Q_{C2}$) exists between the terminals of the capacitors C1 and C2 of each measured sensor 9.

The digital integrator 10 can be implemented, for example, by an up-down counter or by digital counter logic. In addition to the digital integrator 10, also the D/A converter 11 can be controlled by means of the digital counter logic.

The D/A converter 11 positioned in a feedback branch connection has been added to the acceleration sensor measuring circuitry according to the present invention, which converter manages the necessary feedback to the comparator circuit 5. By the use of suitable clocking by means of the clock signal generator 12, a circuitry implementing an appropriate measuring function is achieved. Alternatively, at the input, instead of the digital comparator 5, a combination of a charge amplifier and a comparator may be used.

By means of the solution according to the present invention, the signal of each sensor will separately be converted into digital form. In the solution, the digital conversion is combined with the analog measuring functions for the sensors 9, whereby digital signals are provided as the output signals of the sensors 9. In the solution according to the present invention, further calibration of the sensors may thus be performed digitally immediately, and no separate A/D converters are required.

An advantage of the acceleration sensor measuring circuitry according to the present solution is the replacement of an analog integrator with a digital integrator, whereby the function of the circuit is unaffected by offset errors in the analog integrator. The integrators are also less sensitive to interference, in particular in the multiplexed application. The integrators can be implemented by means of modern sub-micron CMOS technology. The circuitry can also be designed to work at extremely low voltages, below 2.0 volts.

Sensitivity variations in connection with the processing of the sensor element can be calibrated away by adjusting the transfer function of the D/A converter. The digital output signal of the circuit is directly the output of the integrator, which can be transferred for further processing as a signal in either parallel or serial form. The power consumption of the D/A converter can achieve a very low level by means of CMOS technology (CMOS, Complementary Metal Oxide Semiconductor) by using the SC circuit technique (SC, Switched Capacitor).

A further advantage of the circuitry is the replacement of a charge amplifier by a fast comparator. The problem with a charge amplifier is the need for a large uniform range of operation because of the variation in sensor capacitances, as well as, in the multiplexing environment, a need for a wide bandwidth, which makes designing the charge amplifier a challenge and tends to increase the power consumption of the prestage. These problems largely disappear by means of a fast comparator.

The acceleration sensor arrangement measuring circuitry according to the present solution can also be applied to multi-terminal sensors such as, for example, an acceleration sensor with three axes, using time division multiplexing of the signal. The acceleration sensor measuring circuitry according to the present solution can also be developed further to higher precision, i.a, by adding circuit elements to the circuitry, by means of which parasitic capacitances and other non-idealities will be eliminated.

The invention claimed is:

1. A capacitive acceleration sensor arrangement, which arrangement comprises at least one pair of series-connected capacitors having a common central electrode to be measured for the capacitive measuring of acceleration, wherein the arrangement further comprises
    a comparator,
    a digital integrator, and
    a D/A converter positioned in a feedback branch between an output from the digital integrator and the comparator, wherein the comparator, digital integrator and D/A converter are configured such that
    the comparator detects a voltage difference between the output from the digital integrator converted into analog form in the D/A converter, and the central electrode of the pair of capacitors to be measured, and converts the voltage difference into a corresponding digital signal, and
    the digital signal corresponding to the voltage difference obtained from the comparator is added in the digital integrator, from which digital integrator a digital output signal is obtained as output.

2. The capacitive acceleration sensor arrangement according to claim 1, wherein the digital output signal from the digital integrator is directed towards producing a state in which a balance of charge prevails between the terminals of each capacitor in the pair of capacitors to be measured.

3. The capacitive acceleration sensor arrangement according to claim 1, wherein the digital integrator comprises an up-down counter.

4. The capacitive acceleration sensor arrangement according to claim 1, wherein the digital integrator comprises digital counter logic.

5. The capacitive acceleration sensor arrangement according to claim 1, wherein the D/A converter comprises digital counter logic.

6. The capacitive acceleration sensor arrangement according to claim 1, further comprising a clock signal generator, configured to produce a clock signal, in communication with the comparator and the digital integrator, wherein a clocking of the clock signal generator is configured to provide a desired measuring function.

7. The capacitive acceleration sensor arrangement according to claim 1, wherein the comparator comprises a combination of a charge amplifier and a comparator.

8. The capacitive acceleration sensor arrangement according to claim 1, wherein the transfer function of the D/A converter is adjustable to permit digital calibration of the pair of capacitors.

9. A capacitive acceleration sensor arrangement, which arrangement comprises a plurality of sensors, each of which includes a series-connected pair of capacitors having a common central electrode, to be measured for the capacitive measuring of acceleration, wherein the arrangement further comprises:
- a comparator configured to receive input from said plurality of sensors,
- a set of digital integrators,
- a set of time division multiplexers,
- control logic for the multiplexers, and
- a D/A converter positioned in a feedback branch between outputs from the digital integrators, via a first one of said multiplexers, and the comparator,
- wherein the comparator is configured to detect a voltage difference between an output signal from the digital integrators via the first multiplexer as converted into analog form by the D/A converter, and the central electrode of each sensor to be measured, and convert each voltage difference into a corresponding digital signal, and
- wherein each digital integrator is configured to integrate the voltage difference corresponding to a respective sensor of the plurality of sensors, as converted by the comparator, and supplied via a second of said multiplexers, and provide a digital output signal therefrom.

10. The capacitive acceleration sensor arrangement according to claim 9, wherein the multiplexers are configured to operate under time division signal multiplexing to permit the measurement of one sensor at a time in a time slot, and, by taking turns using time division, to permit the measurement of each following sensor in each subsequent time slot.

11. The capacitive acceleration sensor arrangement according to claim 9, wherein the digital output signal from each digital integrator is directed towards producing a state in which a balance of charge prevails between the terminals of each capacitor in the pair of capacitors to be measured for each respective sensor.

12. The capacitive acceleration sensor arrangement according to claim 9, wherein each digital integrator comprises an up-down counter.

13. The capacitive acceleration sensor arrangement according to claim 9, wherein each digital integrator comprises digital counter logic.

14. The capacitive acceleration sensor arrangement according to claim 9, wherein the D/A converter comprises digital counter logic.

15. The capacitive acceleration sensor arrangement according to claim 9, further comprising a clock signal generator, configured to produce a clock signal, in communication with the comparator and the digital integrator, wherein a clocking of the clock signal generator is configured to provide a desired measuring function.

16. The capacitive acceleration sensor arrangement according to claim 9, wherein the comparator comprises a combination of a charge amplifier and a comparator.

17. The capacitive acceleration sensor arrangement according to claim 9, wherein the transfer function of the D/A converter is adjustable to permit digital calibration of the pairs of capacitors to be measured.

18. The capacitive acceleration sensor arrangement according to claim 9, wherein the digital integrators comprise sub-micron CMOS technology.

19. The capacitive acceleration sensor arrangement according to claim 9, wherein said arrangement is configured to work at voltages below 2.0 volts.

20. The capacitive acceleration sensor arrangement according to claim 9, wherein the transfer function of the D/A converter is adjustable for variations in sensitivity associated with the processing of the pairs of capacitors to be measured.

21. The capacitive acceleration sensor arrangement according to claim 9, wherein the digital output signals of the digital integrators are configured to be transferred for further processing as a signal in parallel form.

22. The capacitive acceleration sensor arrangement according to claim 9, wherein the digital output signals of the digital integrators are configured to be transferred for further processing as a signal in serial form.

23. The capacitive acceleration sensor arrangement according to claim 9, wherein the power consumption of the D/A converter is configured for a low level by means of CMOS technology and an SC circuit technique.

24. The capacitive acceleration sensor arrangement according to claim 9, wherein the plurality of sensors comprise multi-terminal sensors.

25. The capacitive acceleration sensor arrangement according to claim 9, wherein the plurality of sensors are arranged to sense on three different axes.

* * * * *